US011211927B2

(12) United States Patent
Sugie

(10) Patent No.: US 11,211,927 B2
(45) Date of Patent: Dec. 28, 2021

(54) GATE DRIVER CIRCUIT, MOTOR DRIVER CIRCUIT, AND HARD DISK APPARATUS

(71) Applicant: ROHM Co., LTD., Kyoto (JP)

(72) Inventor: Hisashi Sugie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/061,760

(22) Filed: Oct. 2, 2020

(65) Prior Publication Data

US 2021/0105013 A1    Apr. 8, 2021

(30) Foreign Application Priority Data

Oct. 4, 2019   (JP) .............................. JP2019-183507

(51) Int. Cl.
| | | |
|---|---|---|
| H03K 3/00 | (2006.01) | |
| H03K 17/00 | (2006.01) | |
| H03K 17/16 | (2006.01) | |
| H03K 17/687 | (2006.01) | |
| H03K 17/30 | (2006.01) | |
| H03K 17/042 | (2006.01) | |
| H03K 17/62 | (2006.01) | |

(52) U.S. Cl.
CPC ..... *H03K 17/687* (2013.01); *H03K 17/04206* (2013.01); *H03K 17/302* (2013.01); *H03K 17/6214* (2013.01)

(58) Field of Classification Search
None
See application file for complete search history.

(56) References Cited

U.S. PATENT DOCUMENTS

| | | | | |
|---|---|---|---|---|
| 7,652,538 B2* | 1/2010 | Choi | ......................... | H03F 1/34 |
| | | | | 330/292 |
| 8,193,863 B2* | 6/2012 | Tsurumi | .................. | H03F 3/305 |
| | | | | 330/264 |
| 8,598,919 B2* | 12/2013 | Koyasu | .................... | G05F 3/267 |
| | | | | 327/109 |
| 8,653,893 B2* | 2/2014 | Tsuchi | ................. | G09G 3/3688 |
| | | | | 330/255 |
| 9,000,811 B2* | 4/2015 | Wang | ................... | H03K 17/163 |
| | | | | 327/108 |
| 9,419,615 B2* | 8/2016 | Hsu | ................ | H03K 19/017509 |
| 9,625,927 B2* | 4/2017 | Imanishi | ................... | G05F 1/59 |
| 9,929,731 B2* | 3/2018 | Zella | ..................... | H03K 17/60 |
| 10,199,007 B2* | 2/2019 | Tsuchi | ............... | H03F 3/45246 |
| 10,571,943 B2* | 2/2020 | Poletto | ............... | H03F 3/45511 |
| 10,951,208 B2* | 3/2021 | Henker | ............ | H03K 19/01721 |

* cited by examiner

*Primary Examiner* — Kenneth B Wells
(74) *Attorney, Agent, or Firm* — Chip Law Group

(57) ABSTRACT

A gate driver circuit drives a switching transistor. A variable current source generates a reference current configured to switch between a first current amount and a second current amount smaller than the first current amount. A current distribution circuit is configured to switch between a source enabled state in which a source current proportional to the reference current is sourced to a gate node of the switching transistor and a disabled state in which the source current is made equal to zero. A first transistor fixes the gate node of the switching transistor to a high voltage in an on-state of the first transistor. A second transistor fixes the gate node of the switching transistor to a low voltage in an on-state of the second transistor.

16 Claims, 11 Drawing Sheets

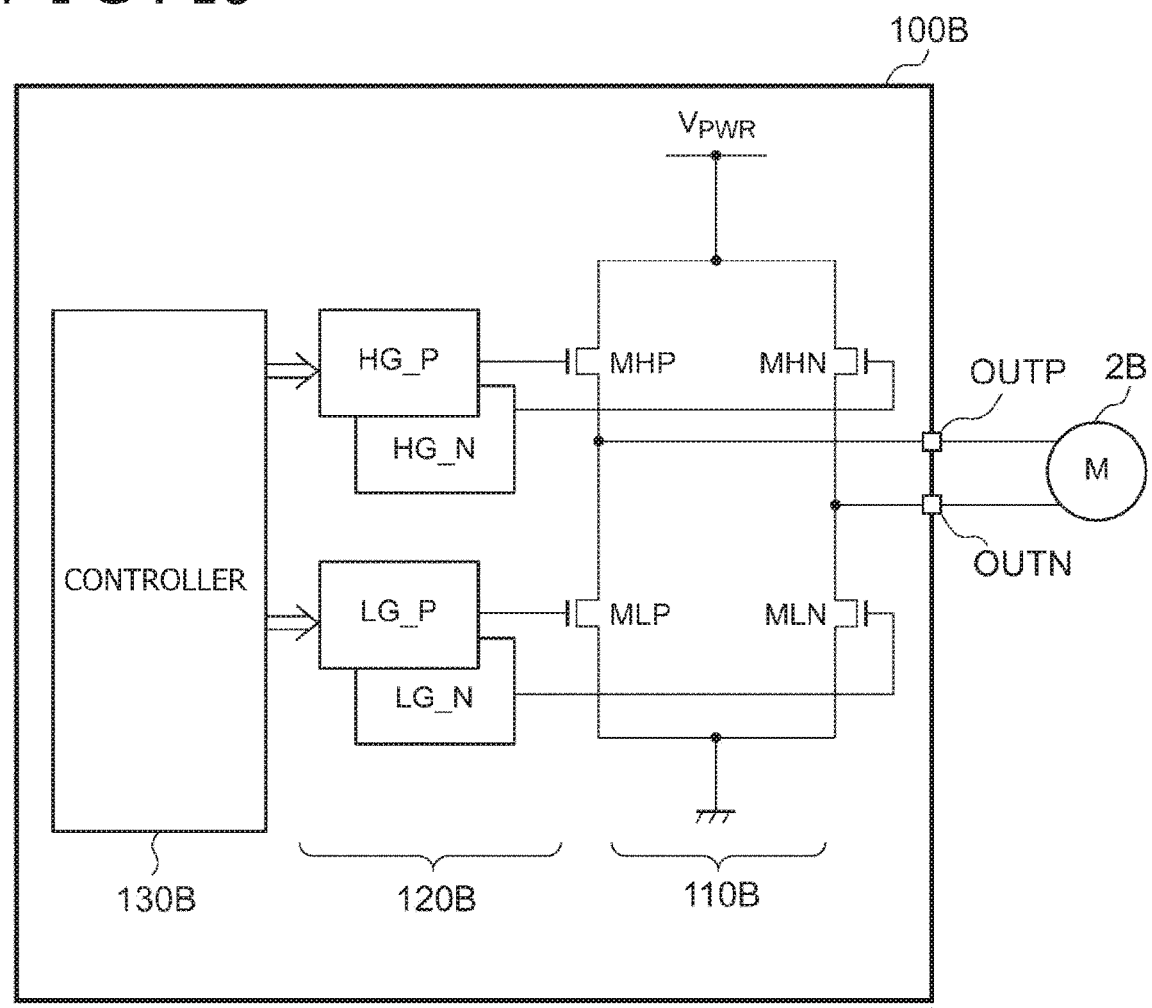
F I G . 10

GATE DRIVER CIRCUIT, MOTOR DRIVER CIRCUIT, AND HARD DISK APPARATUS

CROSS REFERENCE TO RELATED APPLICATIONS

This application claims priority benefit of Japanese Patent Application No. JP 2019-183507 filed in the Japan Patent Office on Oct. 4, 2019. This application is hereby incorporated herein by reference in its entirety.

BACKGROUND

The present disclosure relates to a gate driver circuit.

Various applications including, for example, motor drivers, electric power conversion apparatuses such as convertors or invertors, class D amplifiers, etc., are each configured using one or more of a half-bridge circuit, a single-phase bridge circuit (full-bridge circuit), and a multi-phase bridge circuit (each hereinafter referred to as a switching circuit).

FIG. 1 is a circuit diagram illustrating a basic configuration of such a switching circuit. A switching circuit 200 includes a high-side transistor MH, a low-side transistor ML, a high-side driver 202, a low-side driver 204, and a logic circuit 206.

The switching circuit 200 has three states: (i) a high output state ($V_{OUT}=V_{IN}$) in which the high-side transistor MH is ON and the low-side transistor ML is OFF; (ii) a low output state ($V_{OUT}=0$ V) in which the high-side transistor MH is OFF and the low-side transistor ML is ON; and (iii) a high impedance state in which both the high-side transistor MH and the low-side transistor ML are OFF.

The logic circuit 206 generates a high-side control signal $S_H$ for instructing the high-side transistor MH to turn on or off, and a low-side control signal $S_L$ for instructing the low-side transistor ML to turn on or off.

The high-side driver 202 causes a gate voltage $V_{GH}$ of the high-side transistor MH to be a high voltage $V_H$ when the high-side control signal $S_H$ is in an on-level (for example, in a high level), and causes the gate voltage $V_{GH}$ to be a low voltage ($V_{OUT}$) when the high-side control signal $S_H$ is in an off-level (for example, in a low level).

Similarly, the low-side driver 204 causes a gate voltage $V_{GL}$ of the low-side transistor ML to be a high voltage $V_{DD}$ when the low-side control signal $S_L$ is in an on-level, and causes the gate voltage $V_{GL}$ to be a low voltage (0 V) when the low-side control signal $S_L$ is in an off-level.

In some applications, controlling the rising and falling slopes of the output voltage $V_{OUT}$ is often desired, and the adjustments of the turn-on and turn-off speeds of the high-side transistor MH and the low-side transistor ML are made. For the purpose of use in such adjustments, slew-rate control functions are implemented in the high-side driver 202 and the low-side driver 204. These slew-rate control functions control the rising and falling speeds of the gate voltage $V_{GH}$ of the high-side transistor MH and those of the gate voltage $V_{GL}$ of the low-side transistor ML.

FIG. 2 is a circuit diagram of a low-side driver 600 including such a slew-rate control function. The low-side driver 600 includes a current source 602, current mirror circuits 604 and 606, a first transistor M61, and a second transistor M62. The low-side driver 600 is controlled according to four signals S61 to S64 (corresponding to the control signal $S_L$ of FIG. 1), which are generated by an unillustrated logic circuit.

The current source 602 generates a constant current $I_{SR}$ that defines slew rates.

At the time when the low-side transistor ML is to be turned on, a switch SW63 is turned on to allow the current mirror circuit 604 to source an on-current $I_{ON}$ proportional to the constant current $I_{SR}$ to the gate node of the low-side transistor ML. As a result, the gate voltage $V_{GL}$ of the low-side transistor ML rises with a slope proportional to the on-current $I_{ON}$. Further, the current mirror circuit 604 is configured to copy the constant current $I_{SR}$ and supply a resulting current to the current mirror circuit 606.

Upon completion of the turn-on of the low-side transistor ML, the first transistor M61 is turned on to fix the gate voltage $V_{GL}$ to the high voltage $V_{DD}$, and the switch SW63 is turned off.

At the time when the low-side transistor ML is to be turned off, a switch SW64 is turned on to cause an off-current $I_{OFF}$ proportional to the constant current $I_{SR}$ to be sunk from the gate node of the low-side transistor ML. As a result, the gate voltage $V_{GL}$ of the low-side transistor ML falls with a slope proportional to the off-current $I_{OFF}$.

Upon completion of the turn-off of the low-side transistor ML, the second transistor M62 is turned on to fix the gate voltage $V_{GL}$ to the low voltage 0 V, and the switch SW64 is turned off.

SUMMARY

The inventors have made studies on the circuit diagram of the low-side driver 600 in FIG. 2, and have consequently recognized the following problem. That is, the current ISR generated by the current source 602 continues to flow constantly regardless of the states of the low-side transistor ML. Further, the amount of the current $I_{SR}$ is on the order of several mA and is rarely neglected. Thus, this configuration causes wasted power consumption.

In order to reduce the wasted power consumption, an approach method can also be considered in which the current source 602 is turned on during only turn-on and turn-off periods of the low-side transistor ML, whereas the current source 602 is turned off during the other periods. In this method, however, the electric potential of a connection node N61 between the current mirror circuit 604 and the current source 602 fluctuates every time the current source 602 is turned off, and when the current source 602 is turned on next, a delay occurs until the electric potential of the node N61 returns to an original electric potential. This delay obstructs the high-speed operation of the low-side driver 600.

The present disclosure has been made in view of the above-described problem, and it is desirable to provide a driver circuit configured to reduce its current consumption.

A first mode of the present disclosure relates to a gate driver circuit that drives a switching transistor. The gate driver circuit includes a variable current source that generates a reference current configured to switch between a first current amount and a second current amount smaller than the first current amount, a current distribution circuit configured to switch between a source enabled state in which a source current proportional to the reference current is sourced to a gate node of the switching transistor and a disabled state in which the source current is made equal to zero, a first transistor that fixes the gate node of the switching transistor to a high voltage in an on-state of the first transistor, and a second transistor that fixes the gate node of the switching transistor to a low voltage in an on-state of the second transistor.

According to the first mode, when the gate voltage of the switching transistor is to be raised, a slew rate of the gate voltage of the switching transistor can be controlled by switching the reference current of the variable current source to the first current amount and switching the current distribution circuit to the source enabled state. Further, after the completion of the transition of the gate voltage, the power consumption of the gate driver circuit can be reduced by reducing the reference current to the second current amount. Additionally, operating points of the current distribution circuit can be maintained by allowing the reference current having a small amount to continue to flow. This configuration enables high-speed switching.

In the first mode, the variable current source may be configured to switch between an on-state and an off-state, and may include a first current source that, in the on-state, generates a first current that defines a slew rate of the switching transistor, and a second current source that generates a second current smaller than the first current.

The first current source may include a constant current source and a switch coupled in series to the constant current source.

The current distribution circuit may include a first current mirror circuit that generates the source current proportional to the reference current.

The current distribution circuit may further include a first switch disposed on a path of the source current.

The current distribution circuit may be configured to switch among the source enabled state, the disabled state, and further a sink enabled state in which a sink current proportional to the reference current is sunk from the switching transistor. With this configuration, when the gate voltage of the switching transistor is to be lowered, a slew rate of the gate voltage of the switching transistor can be controlled by switching the reference current of the variable current source to the first current amount and switching the current distribution circuit to the sink enabled state. Further, after the completion of the transition of the gate voltage, the power consumption of the gate driver circuit can be reduced by reducing the reference current to the second current amount. Additionally, the operating points of the current distribution circuit can be maintained by allowing the reference current having a small amount to continue to flow. This configuration enables high-speed switching.

Further, the current distribution circuit may include a first current mirror circuit that generates the source current proportional to the reference current and an intermediate current proportional to the reference current, and a second current mirror circuit that generates the sink current proportional to the intermediate current.

The current distribution circuit may further include a first switch disposed on a path of the source current.

The current distribution circuit may further include a second switch disposed on a path of the intermediate current. Alternatively, the current distribution circuit may further include a second switch disposed on a path of the sink current.

A second mode of the present disclosure is also a gate driver circuit. The gate driver circuit drives the switching transistor and includes a variable current source that generates a reference current configured to switch between a first current amount and a second current amount smaller than the first current amount, a current distribution circuit configured to switch between a sink enabled state in which a sink current proportional to the reference current is sunk from a gate node of the switching transistor and a disabled state in which the sink current is made equal to zero, a first transistor that fixes the gate node of the switching transistor to a high voltage in an on-state of the first transistor, and a second transistor that fixes the gate node of the switching transistor to a low voltage in an on-state of the second transistor.

According to the second mode, when the gate voltage of the switching transistor is to be lowered, a slew rate of the gate voltage of the switching transistor can be controlled by switching the reference current of the variable current source to the first current amount and switching the current distribution circuit to the sink enabled state. Further, after the completion of the transition of the gate voltage, the power consumption of the gate driver circuit can be reduced by reducing the reference current to the second current amount. Additionally, the operating points of the current distribution circuit can be maintained by allowing the reference current having a small amount to continue to flow. This configuration enables high-speed switching.

In the first and second modes, the gate driver circuit may be integrated on one semiconductor substrate. For the "integrated," there are two cases, that is, a first case in which all components of a circuit are formed on a semiconductor substrate and a second case in which main components of the circuit are integrated. In this second case, part of resistors, capacitors, and other components may be provided outside the semiconductor substrate as components for adjusting circuit constants. Integrating a circuit on one chip makes it possible to reduce the area of the circuit and keep the characteristics of circuit elements uniform.

A third mode of the present disclosure relates to a motor driver circuit. The motor driver circuit includes a single-phase or three-phase invertor circuit coupled to a motor, and a drive unit that drives the invertor circuit. The drive unit may include any one of the above-described gate driver circuits according to the first and second modes.

Fourth and fifth modes of the present disclosure relate to a hard disk apparatus. A hard disk apparatus according to the fourth mode may include a spindle motor and the motor driver circuit according to the third mode and configured to drive the spindle motor. A hard disk apparatus according to the fifth mode may include a voice coil motor and the motor driver circuit according to the third mode and configured to drive the voice coil motor.

Note that any combinations of the foregoing constituent elements, and configurations obtained by allowing the constituent elements and the expressions of the present disclosure to be mutually replaced among methods, apparatuses, systems, and any other subject matters are also effective as modes of the present disclosure.

According to the certain modes of the present disclosure, the current consumption of the gate driver circuit can be reduced.

BRIEF DESCRIPTION OF THE DRAWINGS

FIG. 10 is a block diagram of a motor driver circuit; and

DETAILED DESCRIPTION OF THE PREFERRED EMBODIMENTS

Embodiments

Figure 3:
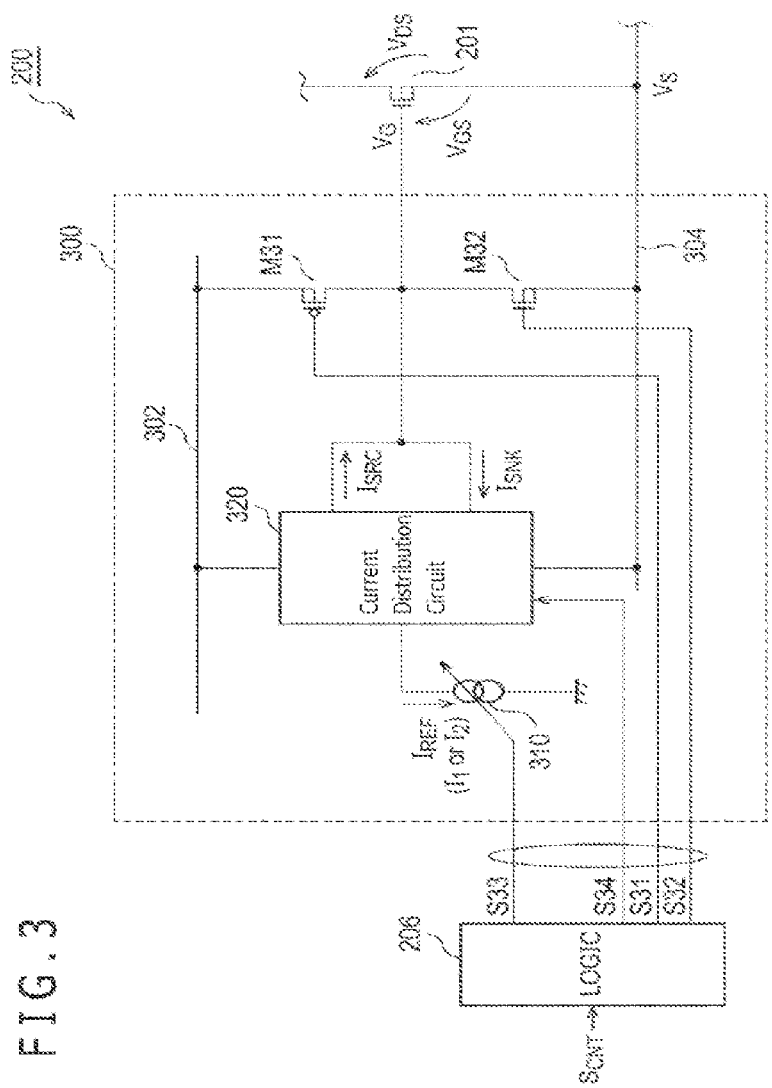
FIG. 3 is a circuit diagram of a gate driver circuit according to an embodiment.

FIG. 3 is a circuit diagram of a gate driver circuit 300 according to an embodiment. The gate driver circuit 300 forms the switching circuit 200, together with a switching transistor 201 targeted for driving. The switching transistor 201 may be a high-side transistor or may be a low-side transistor. In the present embodiment, the switching transistor 201 is an N-channel metal-oxide-semiconductor field-effect transistor (MOSFET). The gate driver circuit 300 causes a gate voltage $V_G$ of the switching transistor 201 to increase to a high voltage $V_H$ so as to turn on the switching transistor 201, and causes the gate voltage $V_G$ to decrease to a low voltage $V_L$ so as to turn off the switching transistor 201.

A high level line 302 is supplied with the high voltage $V_H$, and a low level line 304 is supplied with the low voltage $V_L$. In the case where the switching transistor 201 corresponds to the low-side transistor ML, the high level line 302 is a power source line, namely, $V_H=V_{DD}$, and the low level line 304 is a ground line, namely, $V_L=0$ V. In the case where the switching transistor 201 corresponds to the high-side transistor MH, the high level line 302 is supplied with a high voltage higher than an input voltage $V_{IN}$ of FIG. 1, and the low level line 304 is an output line (switching line) coupled to the source node of the high-side transistor MH.

The gate driver circuit 300 includes a variable current source 310, a current distribution circuit 320, a first transistor M31, and a second transistor M32, and is an integrated circuit (IC) integrated on one semiconductor substrate. The switching transistor 201 targeted for driving may be a discrete component externally attached to a semiconductor chip in which the gate driver circuit 300 is integrated, or may be integrated into a semiconductor chip, together with the gate driver circuit 300.

The gate driver circuit 300 is controlled according to control signals S31, S32, S33, and S34 generated by a logic circuit 206 that receives the control signal $S_{CNT}$.

The variable current source 310 generates a reference current $I_{REF}$ capable of switching between a first current amount $I_1$ and a second current amount $I_2$ smaller than the first current amount $I_1$ ($I_2<I_1$). One of the current amounts $I_1$ and $I_2$ of the reference current $I_{REF}$ is selected according to the control signal S33. The second current amount $I_2$ is preferably smaller than 1/10 of the first current amount $I_1$.

The current distribution circuit 320 is capable of switching according to the control signal S34 among a source enabled state, a sink enabled state, and a disabled state.

In the source enabled state, the current distribution circuit 320 is allowed to source a source current $I_{SRC}$ proportional to the reference current $I_{REF}$ to the gate node of the switching transistor 201. Further, in the sink enabled state, the current distribution circuit 320 is allowed to sink a sink current $I_{SNK}$ proportional to the reference current $I_{REF}$ from the gate node of the switching transistor 201. Further, in the disabled state, both the source current $I_{SRC}$ and the sink current $I_{SNK}$ are made equal to zero.

The first transistor M31 allows its ON/OFF to be controlled according to the control signal S31, and fixes, in its on-state, the gate node of the switching transistor 201 to the high voltage $V_H$. Further, the second transistor M32 allows its ON/OFF to be controlled according to the control signal S32, and fixes, in its on-state, the gate node of the switching transistor 201 to the low voltage $V_L$.

The above is the basic configuration of the gate driver circuit 300. The present disclosure extends to various apparatuses and methods each understood as the block diagram and circuit diagram of FIG. 3 or derived from the above description, and is not limited to a specific configuration. In the following, in order not to narrow the scope of the present disclosure but to help understanding of the essence and operation of the present disclosure and clarify them, further specific configuration examples and embodiments will be described.

Figure 4:
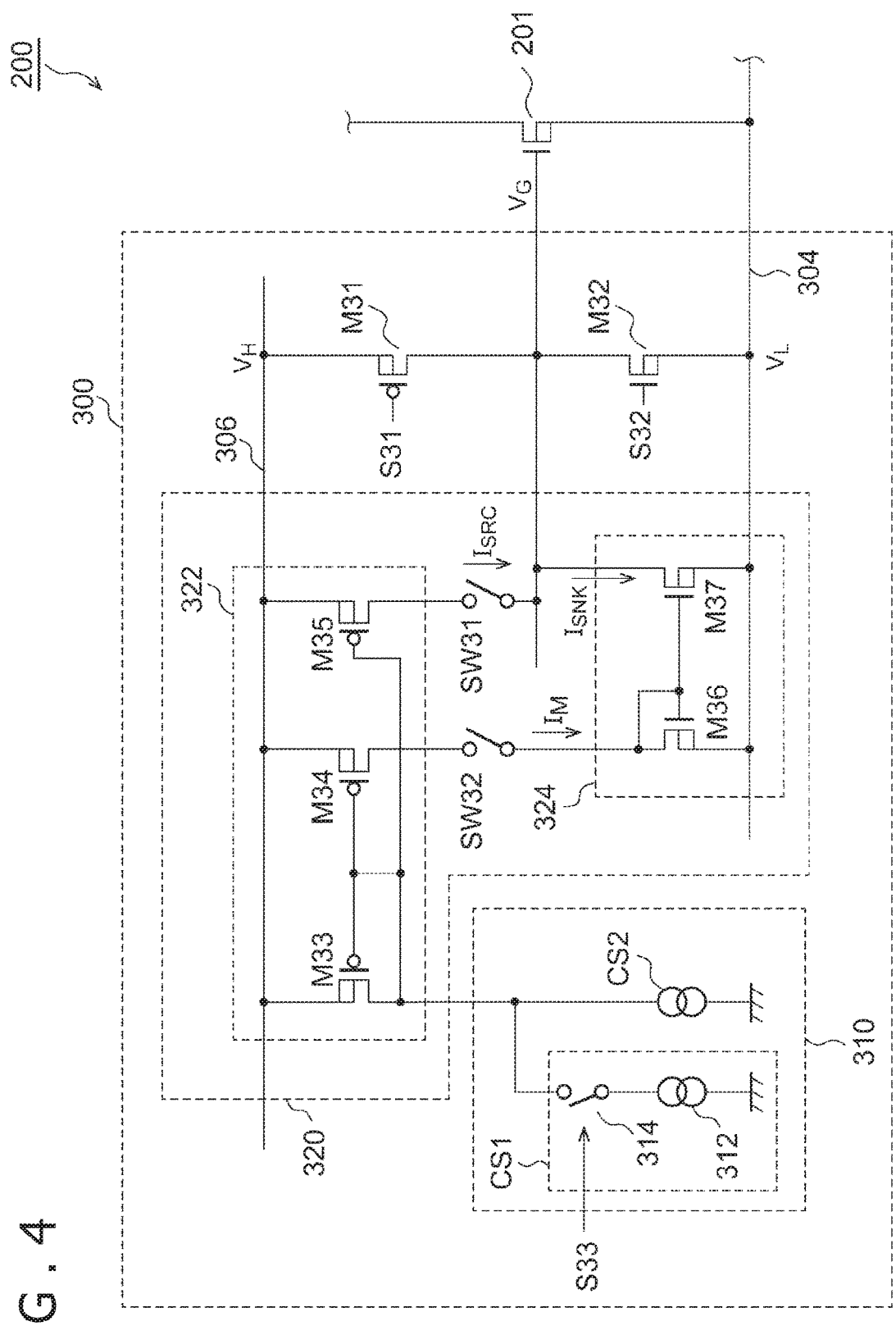
FIG. 4 is a circuit diagram illustrating a specific configuration example of the gate driver circuit.

FIG. 4 is a circuit diagram illustrating a specific configuration example of the gate driver circuit 300. The variable current source 310 includes a first current source CS1 and a second current source CS2. The first current source CS1 is capable of switching its ON/OFF according to the control signal S33, and generates, in its on-state, a first current (hereinafter referred to as a slew rate current) $I_{SR}$ that defines the slew rates of the switching transistor 201. The second current source CS2 generates a second current (hereinafter referred to as a bias maintaining current) $I_{BIAS}$ smaller than the slew rate current $I_{SR}$. The sum of the slew rate current $I_{SR}$ and the bias maintaining current $I_{BIAS}$ is the reference current $I_{REF}$. When the first current source CS1 is ON, the reference current $I_{REF}$ equal to the first current amount $I_1$ is generated.

$$I_{REF}=I_1=I_{SR}+I_{BIAS}$$

Further, when the first current source CS1 is OFF, the reference current $I_{REF}$ equal to the second current amount $I_2$ is generated.

$$I_{REF}=I_2=I_{BIAS}$$

For example, the slew rate current $I_{SR}$ is on the order of several hundred μA to several mA, and the bias maintaining current $I_{BIAS}$ can be made on the order of 1/10 or less of the slew rate current $I_{SR}$, for example, on the order of several μA to several dozen μA. The bias maintaining current $I_{BIAS}$, namely, the second current amount I2, is preferably set as small as possible within a range in which operating points (bias states) of the current distribution circuit 320 can be maintained, regardless of ON/OFF of the slew rate current $I_{SR}$.

The first current source CS1 may include a constant current source 312 and a switch 314 that are coupled to each other in series. When the switch 314 is ON, the slew rate current $I_{SR}$ is allowed to flow, whereas when the switch 314 is OFF, the slew rate current $I_{SR}$ is cut off.

The configuration of the variable current source 310 is not limited to that of FIG. 4, and any other configuration capable of switching between the two current amounts may be employed as the configuration thereof.

The current distribution circuit 320 includes a first current mirror circuit 322, a second current mirror circuit 324, a first switch SW31, and a second switch SW32.

The first current mirror circuit 322 includes transistors M33 to M35, and generates the source current $I_{SRC}$ proportional to the reference current $I_{REF}$. Further, the first current mirror circuit 322 generates an intermediate current $I_M$ proportional to the reference current $I_{REF}$. The intermediate current $I_M$ is supplied to the second current mirror circuit 324.

The second current mirror circuit 324 includes transistors M36 and M37, and generates the sink current $I_{SNK}$ proportional to the intermediate current $I_M$.

The first switch SW31 is disposed on the path of the source current $I_{SRC}$. Further, the second switch SW32 is disposed on the path of the intermediate current $I_M$. The first switch SW31 and the second switch SW32 are controlled according to the control signal S34, and switching among the following three states is made according to the combinations of ON/OFF states of the first switch SW31 and the second switch SW32.

SW31=ON and SW32=OFF: source enabled state
SW31=OFF and SW32=ON: sink enabled state
SW31=OFF and SW32=OFF: disabled state Note that the second switch SW32 may be disposed on the path of the sink current $I_{SNK}$.

Figure 5:
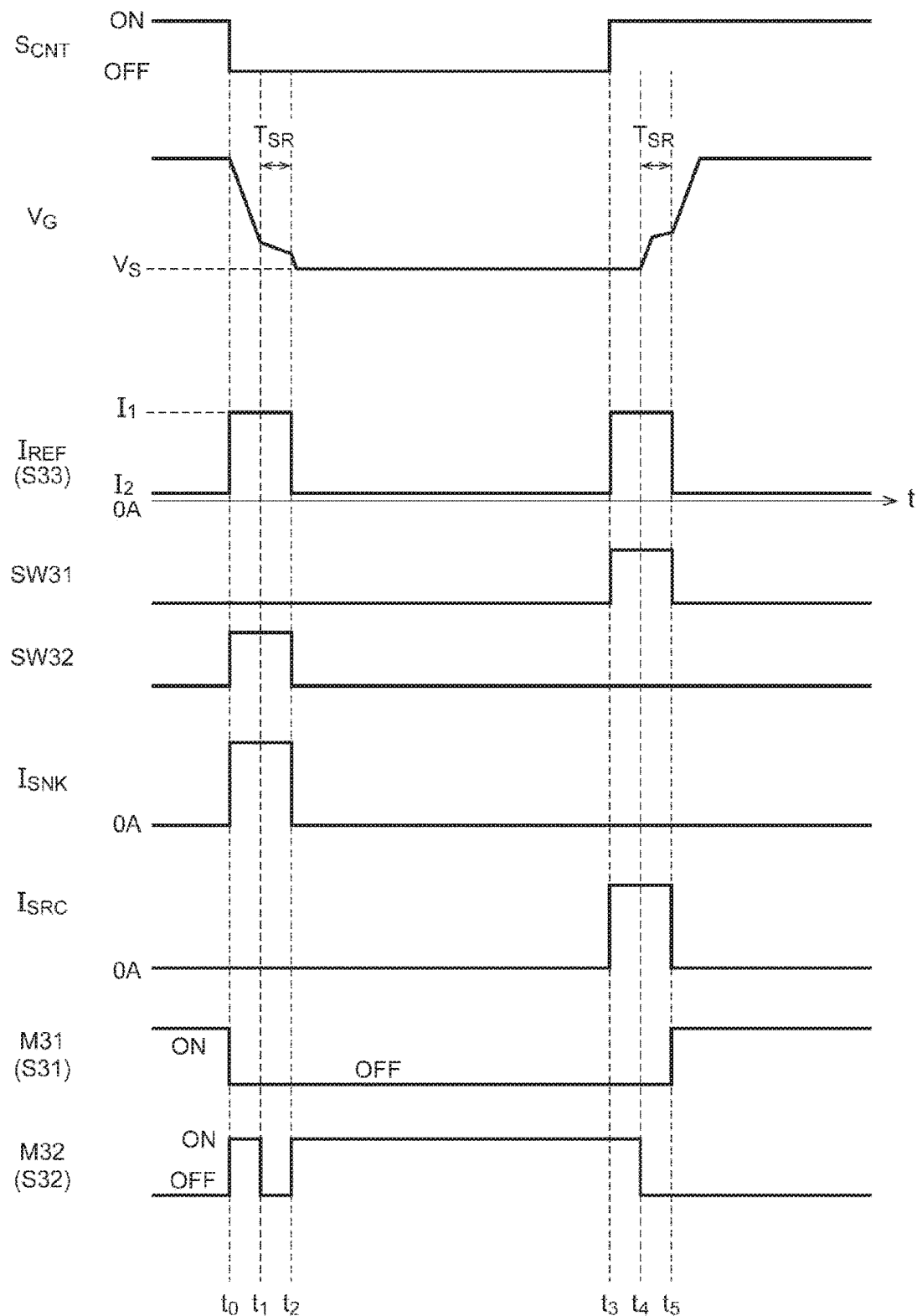
FIG. 5 is an operating waveform diagram of the gate driver circuit of FIG. 4.

The above is the configuration of the gate driver circuit 300. Next, its operation will be described. FIG. 5 is an operating waveform diagram of the gate driver circuit 300 of FIG. 4.

(Turn-Off Operation)

First, the turn-off operation of the switching transistor 201 will be described. Before a time $t_0$, the control signal $S_{CNT}$ is in an on-level (high level) for instructing the switching transistor 201 to turn on. The control signal S31 is in a low level, the first transistor M31 is fully ON, and the gate voltage $V_G$ is fixed to the high level $V_H$. Further, the control signal S33 is in a low level, and the reference current $I_{REF}$ is equal to the second current amount $I_2$.

At the time $t_0$, the control signal $S_{CNT}$ transitions to an off-level (low level) for instructing the switching transistor 201 to turn off. The logic circuit 206 causes the control signals S31 and S32 to increase to high levels so as to turn off the first transistor M31 and turn on the second transistor M32. Immediately after the turn-on of the second transistor M32, the gate voltage $V_G$ decreases with a time elapse. Further, at the time $t_0$, the control signal S33 is changed to a high level to increase the reference current $I_{REF}$ to the first current amount $I_1$. Further, the switch SW32 is turned on to cause the sink current $I_{SNK}$ proportional to the first current amount $I_1$ to be sunk from the gate node of the switching transistor 201. It should be noted here that the sink current $I_{SNK}$ is significantly smaller than a current flowing through the second transistor M32, and thus, the falling speed of the gate voltage $V_G$ during a period from the time $t_0$ to a time $t_1$ is defined by the second transistor M32.

When the gate voltage $V_G$ has decreased to near a threshold voltage $V_{GS\ (th)}$ at the time t1, the second transistor M32 is turned off. A period from the time $t_1$ to a time $t_2$ is a slew-rate adjustment duration $T_{SR}$, and the gate voltage $V_G$ of the switching transistor 201 gradually decreases with a speed according to the sink current $I_{SNK}$. This operation causes a drain-source voltage $V_{DS}$ of the switching transistor 201 to gradually increase.

Upon completion of the slew-rate adjustment duration $T_{SR}$ at the time $t_2$, the second transistor M32 is turned on again, the gate voltage $V_G$ becomes equal to a source voltage $V_S$, and the switching transistor 201 is fixed to OFF.

Further, at the time $t_2$, the second switch SW32 is turned off to cut off the sink current $I_{SNK}$. Further, the control signal S33 is changed to the low level to decrease the reference current $I_{REF}$ to the second current amount $I_2$, thereby causing the current consumption of the circuit to be reduced. Further, the reference current $I_{REF}$ equal to the second current amount $I_2$ continues to flow into the first current mirror circuit 322, thereby allowing the operating points of the current distribution circuit 320 (the gate voltages of the transistors M33 to M35) to be maintained.

(Turn-On Operation)

Next, the turn-on operation of the switching transistor 201 will be described. At a time $t_3$, the control signal $S_{CNT}$ transitions to the on-level. The control signal S33 is changed to the high level to increase the reference current $I_{REF}$ to the first current amount $I_1$. The first switch SW31 is turned on to generate the source current $I_{SRC}$ proportional to the first current amount $I_1$. It should be noted here that, during a period from the time $t_3$ to a time $t_4$, the second transistor M32 remains turned on, and thus, the gate voltage $V_G$ remains fixed to the low voltage $V_S$.

When the second transistor M32 is turned off at the time $t_4$, the gate capacitance of the switching transistor 201 is charged by the source current $I_{SRC}$, and thereby the gate voltage $V_G$ rises. Further, during a slew-rate adjustment duration $T_{SR}$ from the time $t_4$ to a time $t_5$, the gate voltage $V_G$ gradually increases in the vicinity of the threshold voltage $V_{GS\ (th)}$ of the switching transistor 201, and the switching transistor 201 is gradually turned on.

Further, upon completion of the turn-on of the switching transistor 201 at the time $t_5$, the first transistor M31 is turned on, and the switching transistor 201 is fixed to a full-on state. Further, at the time $t_5$, the first switch SW31 is turned off to cut off the source current $I_{SRC}$, and the reference current $I_{REF}$ decreases to the second current amount $I_2$. The reference current $I_{REF}$ equal to the second current amount $I_2$ continues to flow into the first current mirror circuit 322, and thereby the operating points of the current distribution circuit 320 (the gate voltages of the transistors M33 to M35) are maintained.

Figure 1:
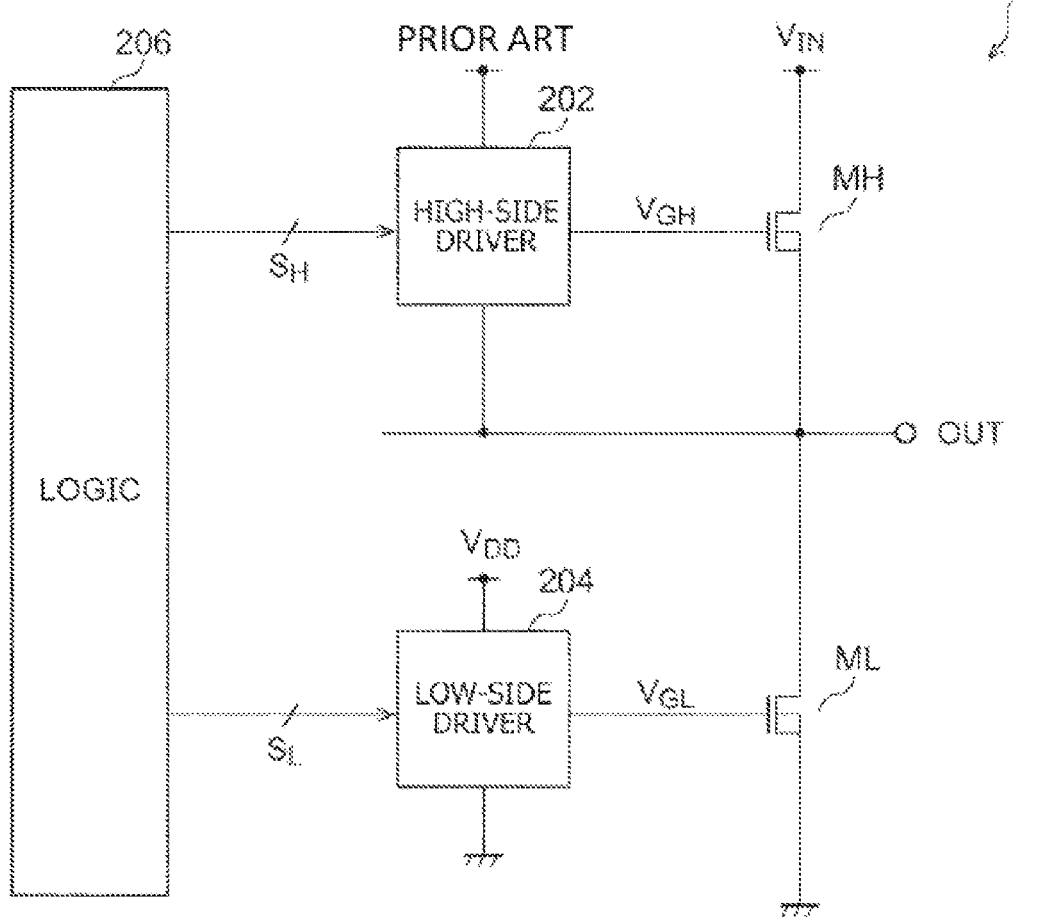
FIG. 1 is a circuit diagram illustrating a basic configuration of a switching circuit.
Figure 2:
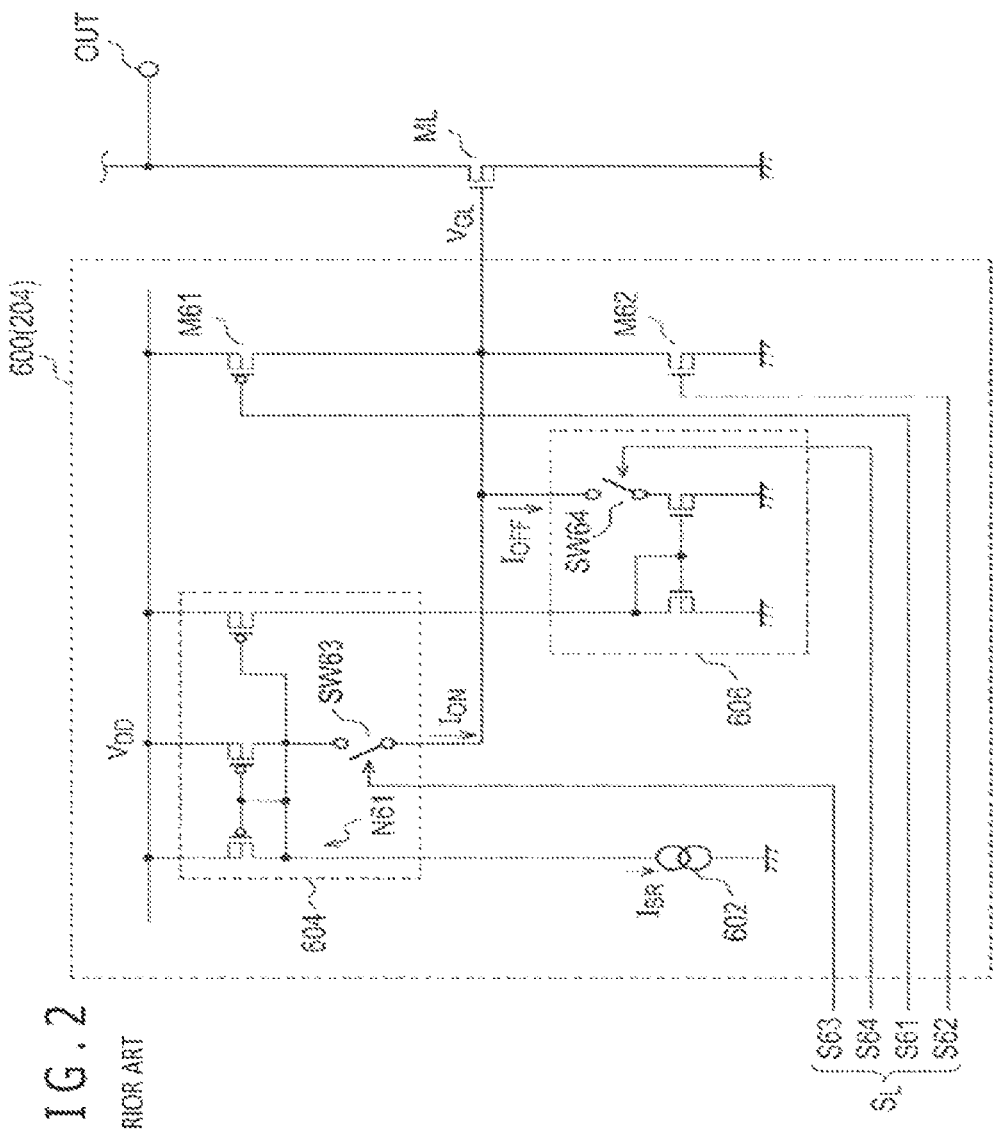
FIG. 2 is a circuit diagram of a driver circuit including a slew rate control function.
Figure 6:
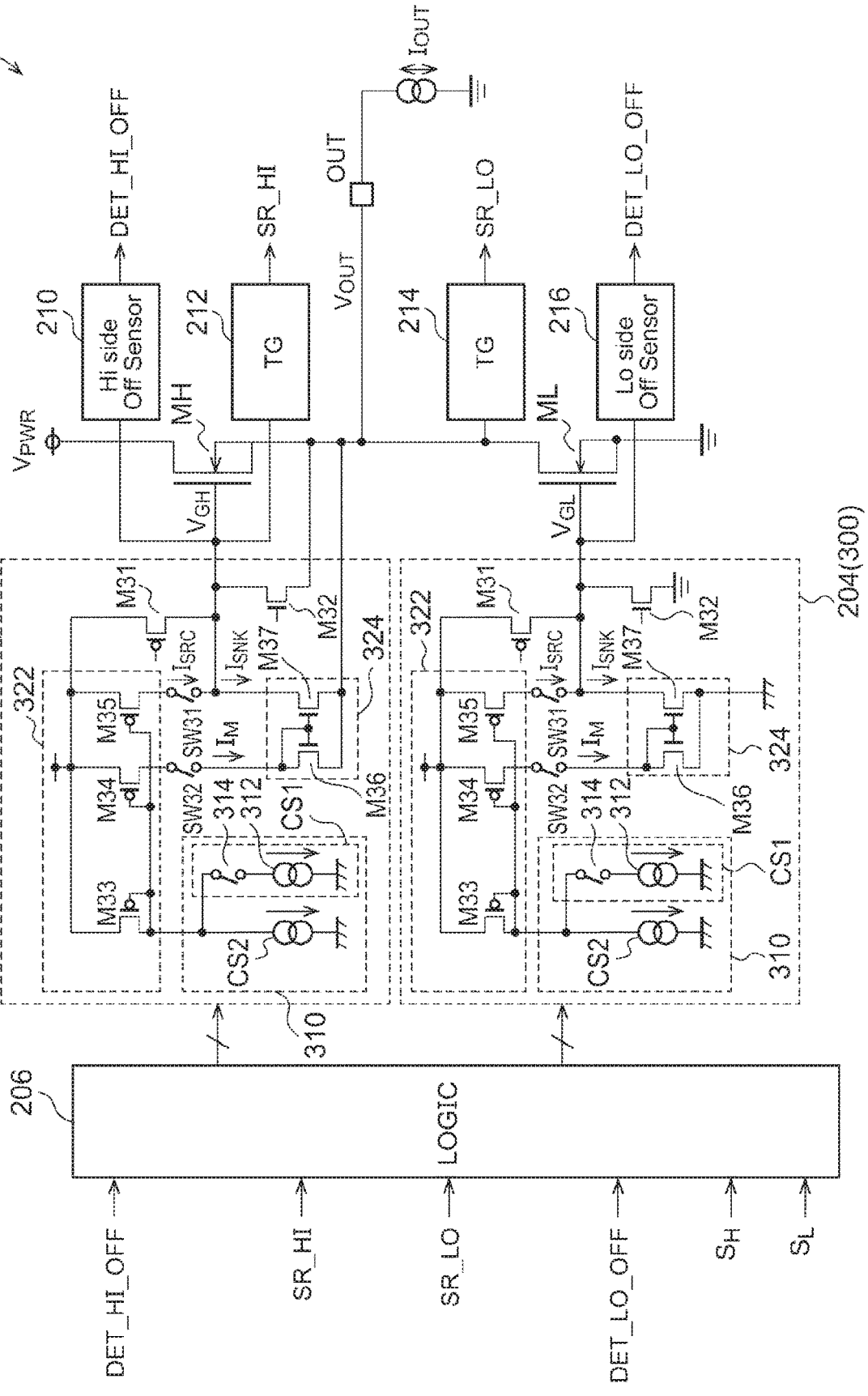
FIG. 6 is a circuit diagram of a switching circuit including the gate driver circuit, according an embodiment.

The above is the operation of the gate driver circuit 300 of FIG. 4. The gate driver circuit 300 can be used in the inverter type (push-pull type) switching circuit 200 as illustrated in FIG. 1. FIG. 6 is a circuit diagram of a switching circuit 200A including the gate driver circuits 300 according to the above-described embodiment.

The switching circuit 200A includes the high-side driver 202, the low-side driver 204, and the logic circuit 206. The high-side driver 202 and the low-side driver 204 each have a configuration similar to that of the gate driver circuit 300 of FIG. 4.

Further, the switching circuit 200A includes a high-side off sensor 210, a low-side off sensor 216, a timing generator 212, and a timing generator 214 that are used for monitoring the states of the high-side transistor MH and the low-side transistor ML.

A control signal SH and a control signal $S_L$ for respectively instructing the high-side transistor MH and the low-side transistor ML to turn on or off are input to the logic circuit 206. The logic circuit 206 generates a set of control signals for the high-side driver 202 and a set of control signals for the low-side driver 204 on the basis of the control signals $S_H$ and $S_L$ and a plurality of outputs of the sensors 210 and 216 and the timing generators 212 and 214.

The high-side off sensor 210 detects that the high-side transistor MH has been brought to a turn-off state, on the basis of the gate voltage $V_{GH}$ of the high-side transistor MH. Specifically, the high-side off sensor 210 compares a gate-source voltage $V_{GS}$ of the high-side transistor MH with a threshold voltage $V_{TH\ (OFF)}$, and upon satisfaction of a condition represented by $V_{GS}<V_{TH\ (OFF)}$, the high-side off sensor 210 asserts a signal DET_HI_OFF (for example, causes it to increase to a high level), which indicates the detection of the turn-off of the high-side transistor MH.

The first timing generator 212 generates the timing of a start point or an end point of one slew-rate adjustment duration $T_{SR}$, the timing being used in the slew-rate adjustment made by the high-side driver 202. For example, the first timing generator 212 compares the gate voltage $V_{GH}$ of the high-side transistor MH with a predetermined threshold voltage $V_{TH1}$ ($>V_{PWR}$), and asserts a timing signal SR_HI according to the result of the comparison.

The second timing generator 214 generates the timing of a start point or an end point of one slew-rate adjustment duration $T_{SR}$, the timing being used in the slew-rate adjustment made by the low-side driver 204. For example, the second timing generator 214 compares the output voltage $V_{OUT}$ with a predetermined threshold voltage $V_{TH2}$, and outputs a timing signal SR_LO according to the result of the comparison.

The low-side off sensor 216 detects that the low-side transistor ML has been brought to a turn-off state, on the basis of the gate voltage $V_{GL}$ of the low-side transistor ML. Specifically, the low-side off sensor 216 compares a gate-source voltage $V_{GS}$ of the low-side transistor ML with the threshold voltage $V_{TH\ (OFF)}$, and upon satisfaction of a condition represented by $V_{GS}<V_{TH\ (OFF)}$, the low-side off sensor 216 asserts a signal DET_LO_OFF (for example, causes it to increase to a high level), which indicates the detection of the turn-off of the low-side transistor ML.

The above is the configuration of the switching circuit 200A. Next, its operation will be described. The logic circuit 206 switches the operations of the high-side driver 202 and the low-side driver 204 according to the polarity of an output current $I_{OUT}$.

(Current Sink State)

Figure 7:
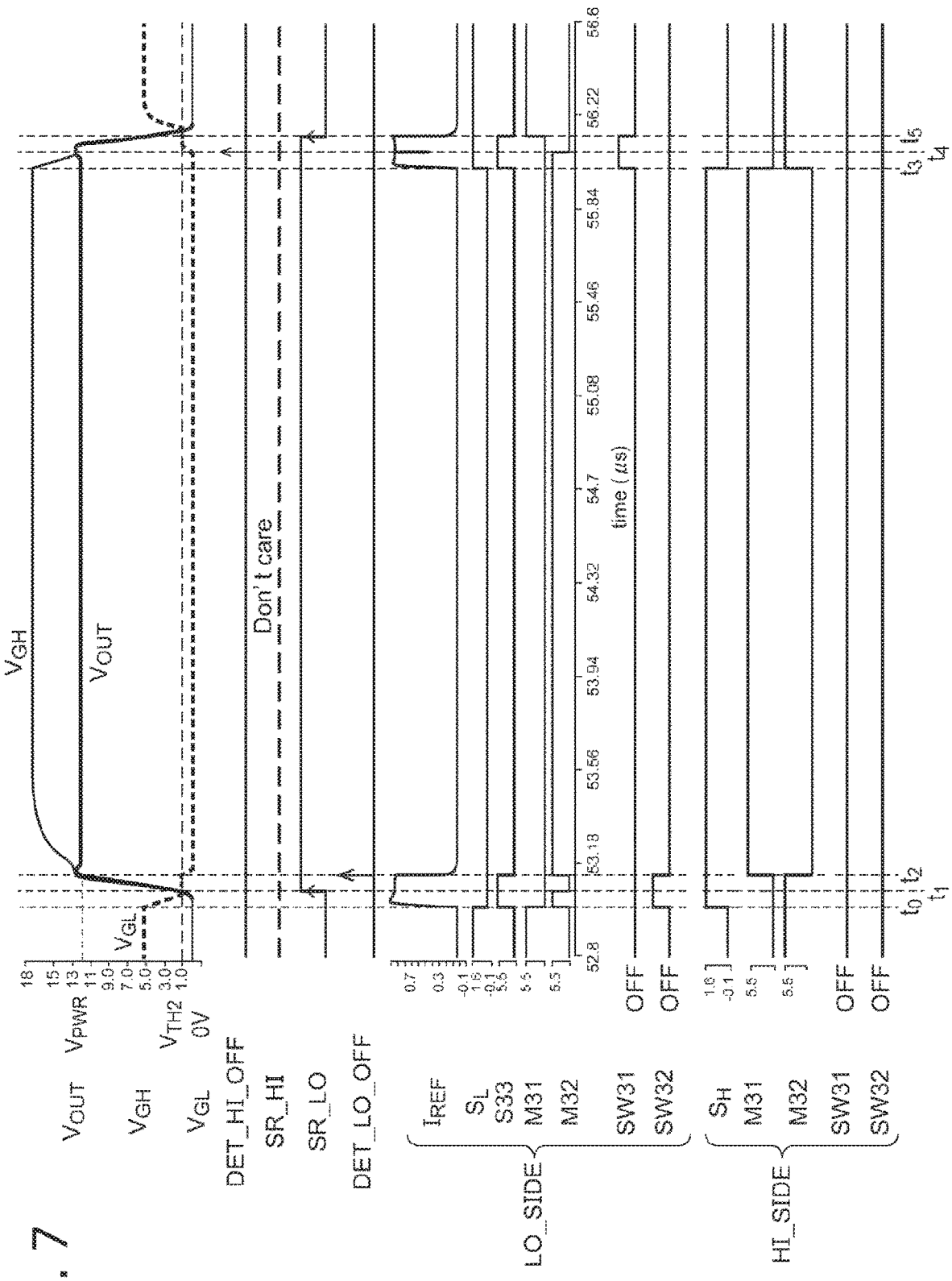
FIG. 7 is an operating waveform diagram of the switching circuit at the time when it sinks an output current.

FIG. 7 is an operating waveform diagram of the switching circuit 200A at the time when it sinks the output current $I_{OUT}$. When sinking the output current $I_{OUT}$, the switching circuit 200A uses the low-side driver 204 and configures the slew rates of the output voltage $V_{OUT}$ by controlling the turn-on and turn-off speeds of the low-side transistor ML.

At a time $t_0$, the control signal $S_H$ transitions to a high level, and the control signal $S_L$ transitions to a low level. The low-side driver 204 first starts to operate, and causes the low-side transistor ML to turn off. A slew rate at the time when the output voltage $V_{OUT}$ rises is controlled on the basis of the gate voltage $V_{GL}$ of the low-side transistor ML.

The operation of the low-side driver 204 during a period from the time $t_0$ to a time $t_2$ is as described with reference to FIG. 5. That is, at the time $t_0$, the second transistor M32 is turned on once to decrease the gate voltage $V_{GL}$. Upon satisfaction of a condition represented by $V_{OUT}>V_{TH2}$ at the time $t_1$, the timing generator 214 outputs an SR_LO signal having a high level. In response to the SR_LO signal, the procedure transitions to the slew-rate adjustment duration $T_{SR}$, and the low-side driver 204 allows the gate voltage $V_{GL}$ of the low-side transistor ML to gradually decrease according to the sink current $I_{SNK}$.

At the time $t_2$, the low-side off sensor 216 detects the completion of the turn-off of the low-side transistor ML, and asserts the DET_LO_OFF signal. In response to this signal, the high-side driver 202 causes the high-side transistor MH to turn on. In the high-side driver 202, the slew rate control is not performed, and the switches SW31 and SW32 remain turned off.

At a time $t_3$, the control signal $S_H$ transitions to a low level, and the control signal $S_L$ transitions to a high level. The high-side driver 202 first starts to operate, and causes the high-side transistor MH to turn off. At this time, in the high-side driver 202, the slew rate control is not performed, and the switches SW31 and SW32 remain turned off.

At a time $t_4$, the turn-off of the high-side transistor MH is detected, and the DET_HI_OFF signal is asserted. In response to this signal, the low-side driver 204 causes the low-side transistor ML to turn on. A slew rate at the time when the output voltage $V_{OUT}$ falls is also controlled on the basis of the gate voltage $V_{GL}$ of the low-side transistor ML.

Specifically, in response to the assertion of the DET_HI_OFF signal, the procedure transitions to the slew-rate adjustment duration $T_{SR}$, and the low-side driver 204 allows the gate voltage $V_{GL}$ of the low-side transistor ML to gradually increase according to the source current $I_{SRC}$.

Further, when the output voltage $V_{OUT}$ becomes lower than the threshold voltage $V_{TH2}$ at a time $t_5$, the SR_LO signal is changed to a low level, the slew-rate adjustment duration $T_{SR}$ is completed, and the first transistor M31 is turned on. This operation causes the gate voltage $V_{GL}$ to rapidly rise, and then, the turn-on of the low-side transistor ML is completed.

(Current Source State)

Figure 8:
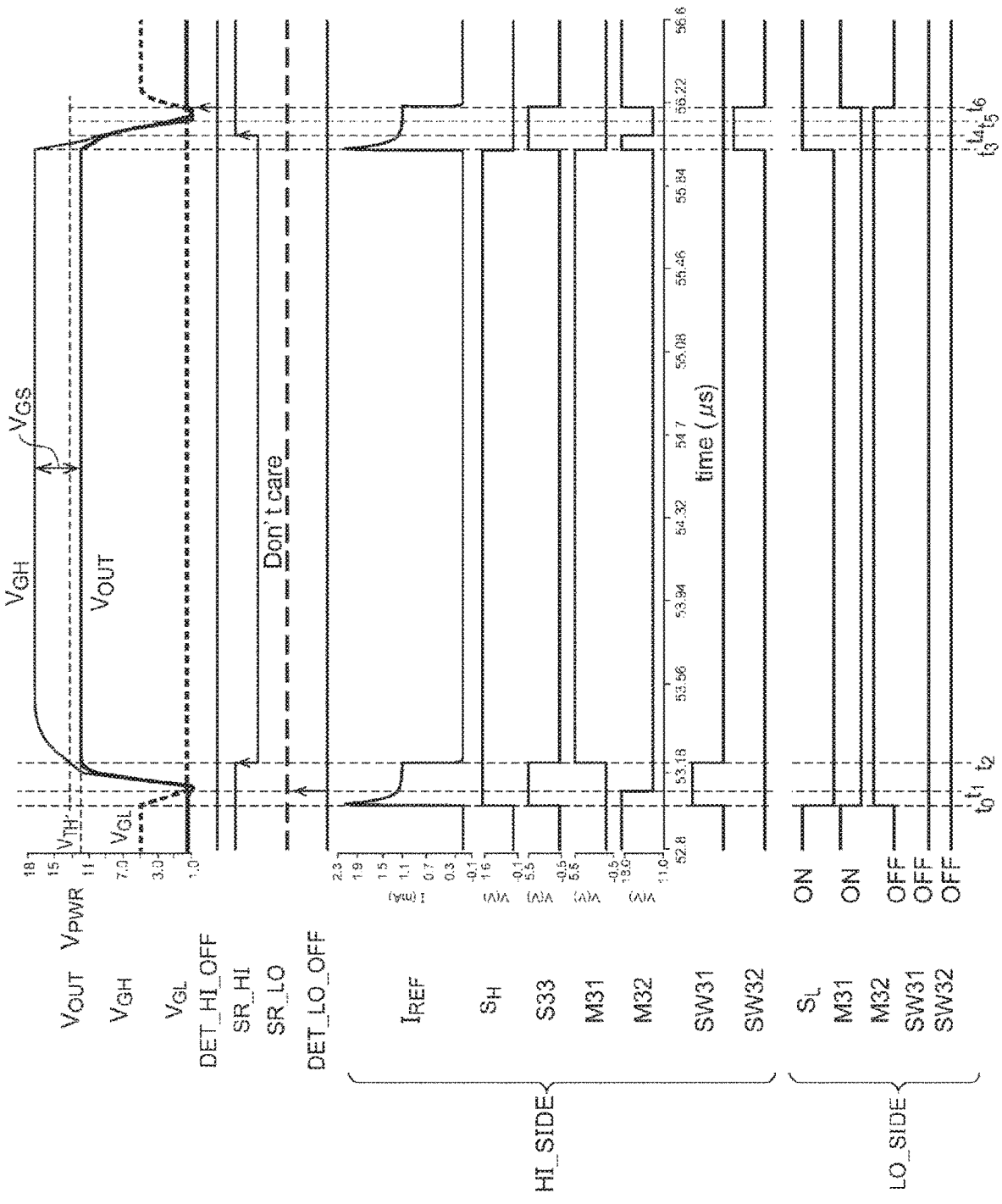
FIG. 8 is an operating waveform diagram of the switching circuit at the time when it sources an output current.

FIG. 8 is an operating waveform diagram of the switching circuit 200A at the time when it sources the output current $I_{OUT}$. When sourcing the output current $I_{OUT}$, the switching circuit 200A uses the high-side driver 202 and configures the slew rates of the output voltage $V_{OUT}$ by controlling the turn-on and turn-off speeds of the high-side transistor MH.

At a time $t_0$, the control signal $S_H$ transitions to the high level, and the control signal $S_L$ transitions to the low level. The low-side driver 204 first starts to operate, and causes the low-side transistor ML to turn off. In the low-side driver 204, the slew rate control is not performed, and the switches SW31 and SW32 remain turned off.

When the gate voltage $V_{GL}$ of the low-side transistor ML becomes lower than the threshold voltage $V_{TH\ (OFF)}$ at a time $t_1$, the DET_LO_OFF signal is asserted. In response to this signal, the high-side driver 202 causes the high-side transistor MH to turn on. In the high-side driver 202, the slew rate control is performed as follows.

When the second transistor M32 of the high-side driver 202 is turned off at the time $t_1$, the source current $I_{SRC}$ is supplied to the gate node of the high-side transistor MH, and the procedure transitions to the slew-rate adjustment duration $T_{SR}$. A gate-source voltage $V_{GS}$ ($=V_{GH}-V_{OUT}$) gradually increases, and the output voltage $V_{OUT}$ also rises with a constant speed.

When the gate voltage $V_{GH}$ of the high-side transistor MH exceeds the threshold voltage $V_{TH1}$ at a time $t_2$, the timing generator 212 causes the SR_HI signal to decrease to a low level. With this operation, the slew-rate adjustment duration $T_{SR}$ ends. Further, the first transistor M31 is turned on, and the high-side transistor MH enters a fully turned-on state.

At a time $t_3$, the control signal $S_H$ transitions to the low level, and the control signal $S_L$ transitions to the high level. The high-side driver 202 first starts to operate, and causes the high-side transistor MH to turn off. First, the second transistor M32 is turned on to decrease the gate voltage $V_{GH}$ of the high-side transistor MH. When the gate voltage $V_{GH}$ becomes lower than the threshold voltage $V_{TH1}$ at a time $t_4$, the SR-HI signal increases to the high level, and the slew-rate adjustment duration $T_{SR}$ starts. During the slew-rate adjustment duration $T_{SR}$, the sink current $I_{SNK}$ is drawn out from the gate node of the high-side transistor MH, the gate-source voltage $V_{GS}$ ($=V_{GH}-V_{OUT}$) gradually decreases, and the output voltage $V_{OUT}$ decreases with a constant speed.

When the gate-source voltage $V_{GS}$ of the high-side transistor MH becomes lower than the threshold voltage $V_{TH\ (OFF)}$ at a time $t_5$, the DET_HI_OFF signal, which indicates the completion of the turn-off of the high-side transistor MH, is asserted. In response to the assertion of the DET_HI_OFF signal, the low-side driver 204 enters an active state, and causes the low-side transistor ML to turn on.

(Application)

Figure 9:
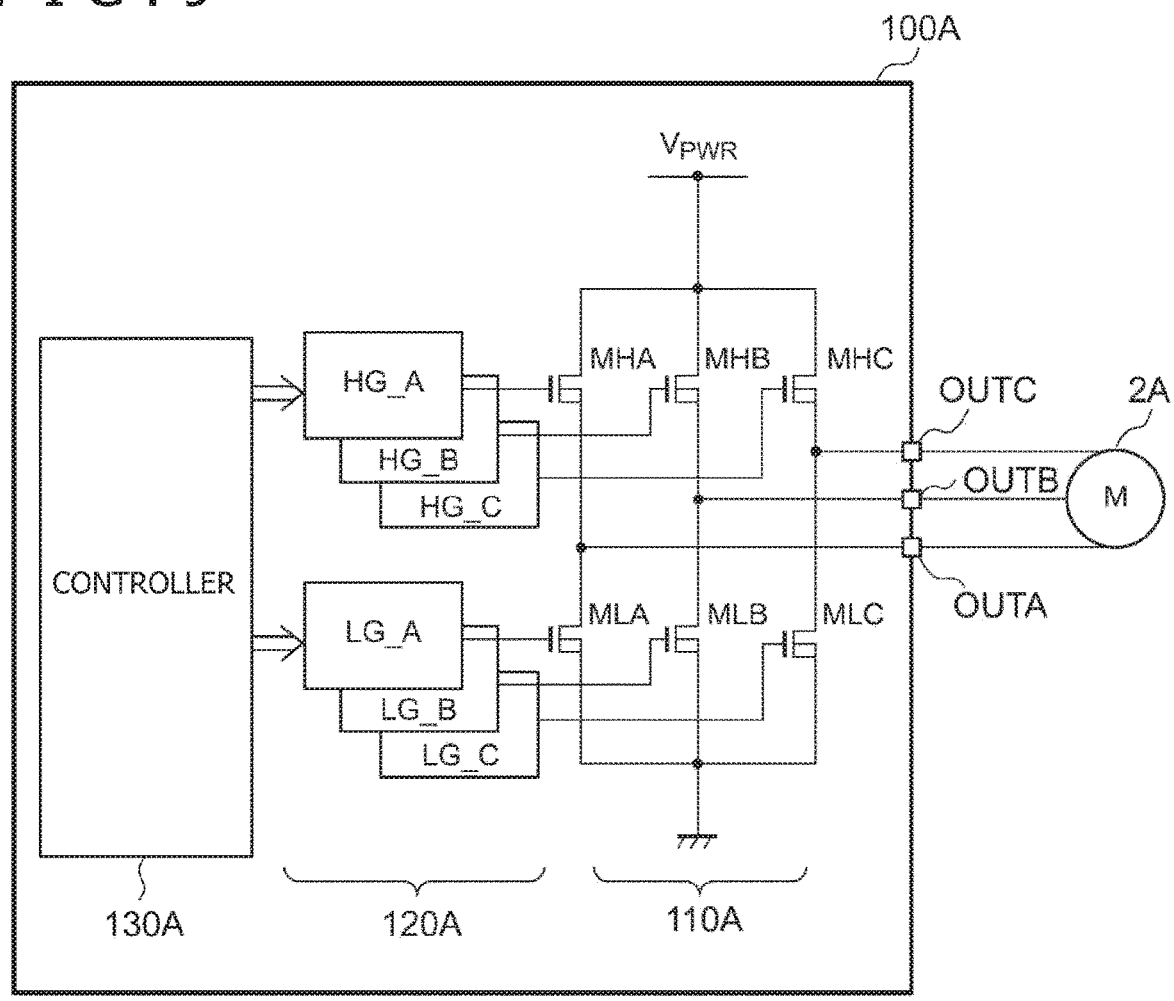
FIG. 9 is a block diagram of a motor driver circuit.

The gate driver circuit 300 can be applied to, for example, a motor driver circuit although the application of the gate driver circuit 300 is not particularly limited. FIG. 9 is a block diagram of a motor driver circuit 100A. A motor 2A is a three-phase motor, and the motor driver circuit 100A includes a three-phase invertor circuit 110A, a gate drive circuit 120A, and a controller 130A. The three-phase invertor circuit 110A includes an A-phase leg, a B-phase leg, and a C-phase leg, and each of the legs includes a high-side transistor and a low-side transistor.

The gate drive circuit 120A includes high-side drivers HG_A to HG_C for driving high-side transistors MHA to MHC of the three-phase invertor circuit 110A, and low-side drivers LG_A to LG_C for driving low-side transistors MLA to MLC of the three-phase invertor circuit 110A. The high-side drivers HG_A to HG_C and the low-side drivers LG_A to LG_C each correspond to the above-described gate driver circuit 300.

FIG. 10 is a block diagram of a motor driver circuit 100B. A motor 2B is a single-phase motor, and the motor driver circuit 100B includes an H bridge circuit (single-phase invertor) 110B, a gate drive circuit 120B, and a controller 130B.

The H bridge circuit 110B includes high-side transistors MHP and MHN and low-side transistors MLP and MLN.

The gate drive circuit 120B includes high-side drivers HG_P and HG_N for driving the high-side transistors MHP and MHN of the H bridge circuit 110B, and low-side drivers LG_P and LG_N for driving the low-side transistors MLP and MLN of the H bridge circuit 110B. The high-side drivers HG_P and HG_N and the low-side drivers LG_P and LG_N each correspond to the above-described gate driver circuit 300.

Although the application of the motor driver circuit 100 is not particularly limited, the motor driver circuit 100 can be used for driving, for example, a spindle motor and a voice coil motor of each of a hard disk apparatus, a digital versatile disc (DVD) drive, a Blu-ray (registered trademark) disk drive, and the like.

Figure 11:
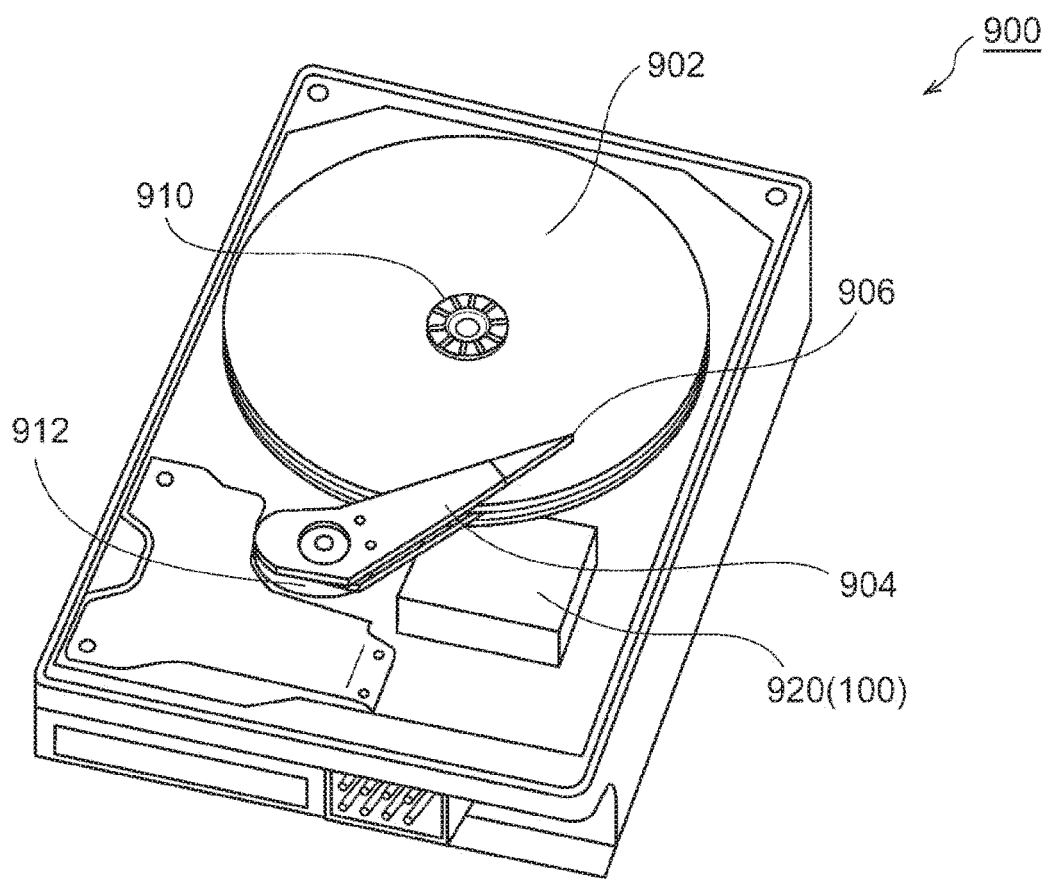
FIG. 11 is a diagram illustrating a hard disk apparatus including motor driver circuits.

FIG. 11 is a diagram illustrating a hard disk apparatus 900 including the motor driver circuits 100A and 100B. The hard disk apparatus 900 includes a platter 902, a swing arm 904, a head 906, a spindle motor 910, a voice coil motor 912, and a motor driver 920. The motor driver 920 includes drive circuits for driving the spindle motor 910 and the voice coil motor 912. The drive circuit for the spindle motor 910 corresponds to the motor driver circuit 100A of FIG. 9, and the drive circuit for the voice coil motor 912 corresponds to the motor driver circuit 100B of FIG. 10. These drive circuits can be configured using the architecture of the above-described gate driver circuit 300.

Heretofore, the present disclosure has been described on the basis of the embodiments. The embodiments are just examples, and it can be understood by those skilled in the art that various modification examples can be made in the combinations of individual components and individual processing processes of the embodiments and that such modification examples are within the scope of the present disclosure. Hereinafter, such modification examples will be described.

MODIFICATION EXAMPLE 1

The configurations of the timing generators 212 and 214 of FIG. 4 are not particularly limited, and any configuration that is simply capable of determining the start point or the end point of a slew-rate adjustment duration may be employed as the configurations thereof. For example, the timing generator 212 may compare the output voltage $V_{OUT}$ with a threshold voltage equal to $V_{PWR}-V_{TH}$. Alternatively, the timing generators 212 and 214 may be each configured by a timer circuit.

MODIFICATION EXAMPLE 2

In the above embodiment, the gate driver circuit 300 has been described, in which a selection among the three states, namely, the source enabled state, the sink enabled state, and the disabled state, can be made. The gate driver circuit 300, however, may be configured such that switching between only two states, namely, the sink enabled state and the disabled state, can be made, or may be configured such that switching between only two states, namely, the source enabled state and the disabled state, can be made.

MODIFICATION EXAMPLE 3

In the above embodiment, the motor driver has been described as the application of the gate driver circuit 300, but the application of the gate driver circuit 300 is not particularly limited.

What is claimed is:

1. A gate driver circuit that drives a switching transistor, the gate driver circuit comprising:
a variable current source configured to:
generate a reference current; and
control switching between a first current amount of the reference current and a second current amount of the reference current smaller than the first current amount, wherein
the switching is based on a transition of a voltage level of a gate voltage at a gate node of the switching transistor from a first voltage level to a second voltage level higher than the first voltage level,
the reference current is switched to the first current amount during the transition of the voltage level of the gate voltage at the gate node of the switching transistor from the first voltage level to the second voltage level, and
the reference current is switched to the second current amount after the transition of the voltage level of the gate voltage at the gate node of the switching transistor from the first voltage level to the second voltage level;
a current distribution circuit configured to switch between a source enabled state and a disabled state, wherein
a source current proportional to the reference current having the first current amount or the second current amount is sourced to the gate node of the switching transistor in the source enabled state, and
the source current is made equal to zero in the disabled state;

a first transistor configured to fix the gate node of the switching transistor to the second voltage level in an on-state of the first transistor; and a second transistor configured to fix the gate node of the switching transistor to the first voltage level in an on-state of the second transistor.

2. The gate driver circuit according to claim 1, wherein the variable current source further comprises a first current source and a second current source, the first current source is configured to:
  switch between an on-state and an off-state; and
  generate a first current having the first current amount, wherein the first current defines a slew rate of the switching transistor, the second current source is configured to:
  switch between the on-state and the off-state; and
  generate a second current having the second current amount, wherein
    the second current defines a bias maintaining current in the switching transistor, and
    the second current is smaller than the first current.

3. The gate driver circuit according to claim 2, wherein the first current source includes:
  a constant current source; and
  a switch coupled in series to the constant current source.

4. The gate driver circuit according to claim 1, wherein the current distribution circuit includes a first current mirror circuit, and
the first current mirror circuit is configured to generate the source current proportional to the reference current.

5. The gate driver circuit according to claim 4, wherein the current distribution circuit further includes a first switch disposed on a path of the source current.

6. The gate driver circuit according to claim 1, wherein the current distribution circuit is further configured to switch among the source enabled state, the disabled state, and a sink enabled state, and
a sink current proportional to the reference current is sunk from the switching transistor in the sink enabled state.

7. The gate driver circuit according to claim 6, wherein the current distribution circuit further includes:
  a first current mirror circuit configured to:
    generate the source current proportional to the reference current and
    generate an intermediate current proportional to the reference current, and
  a second current mirror circuit configured to generate the sink current proportional to the intermediate current.

8. The gate driver circuit according to claim 7, wherein the current distribution circuit further includes a first switch disposed on a path of the source current.

9. The gate driver circuit according to claim 8, wherein the current distribution circuit further includes a second switch disposed on a path of the intermediate current.

10. The gate driver circuit according to claim 8, wherein the current distribution circuit further includes a second switch disposed on a path of the sink current.

11. The gate driver circuit according to claim 1, wherein the second current amount is 1/10 of the first current amount.

12. The gate driver circuit according to claim 1, wherein the gate driver circuit is configured to be integrated on a semiconductor substrate.

13. A motor driver circuit, comprising:
  a single-phase invertor circuit or a three-phase invertor circuit coupled to a motor; and
  a drive unit configured to drive one of the single-phase invertor circuit or the three-phase invertor circuit, wherein
    the drive unit includes the gate driver circuit according to claim 1.

14. The gate driver circuit according to claim 1, wherein the current distribution circuit and the first transistor are both connected to a common supply line.

15. The gate driver circuit according to claim 1, wherein the current distribution circuit and the second transistor are both connected to one of a ground or a source node of the switching transistor.

16. A gate driver circuit that drives a switching transistor, the gate driver circuit comprising:
  a variable current source configured to:
    generate a reference current; and
    control switching between a first current amount of the reference current and a second current amount of the reference current smaller than the first current amount, wherein
      the switching is based on a transition of a voltage level of a gate voltage at a gate node of the switching transistor from a first voltage level to a second voltage level higher than the first voltage level,
      the reference current is switched to the first current amount during the transition of the voltage level of the gate voltage at the gate node of the switching transistor from the first voltage level to the second voltage level, and
      the reference current is switched to the second current amount after the transition of the voltage level of the gate voltage at the gate node of the switching transistor from the first voltage level to the second voltage level;
  a current distribution circuit configured to switch between a sink enabled state and a disabled state, wherein
    a sink current proportional to the reference current having the first current amount or the second current amount is sunk from the gate node of the switching transistor in the sink enabled state, and
    the sink current is made equal to zero in the disabled state;
  a first transistor configured to fix the gate node of the switching transistor to the second voltage level in an on-state of the first transistor; and
  a second transistor configured to fix the gate node of the switching transistor to the first voltage level in an on-state of the second transistor.

* * * * *